(12) United States Patent
Li et al.

(10) Patent No.: US 11,901,333 B2
(45) Date of Patent: Feb. 13, 2024

(54) NO MOLD SHELF PACKAGE DESIGN AND PROCESS FLOW FOR ADVANCED PACKAGE ARCHITECTURES

(71) Applicant: Intel Corporation, Santa Clara, CA (US)

(72) Inventors: Wei Li, Chandler, AZ (US); Edvin Cetegen, Chandler, AZ (US); Nicholas S. Haehn, Scottsdale, AZ (US); Ram S. Viswanath, Phoenix, AZ (US); Nicholas Neal, Gilbert, AZ (US); Mitul Modi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 16/596,367

(22) Filed: Oct. 8, 2019

(65) Prior Publication Data
US 2021/0104490 A1 Apr. 8, 2021

(51) Int. Cl.
*H01L 25/065* (2023.01)
*H01L 23/31* (2006.01)
(Continued)

(52) U.S. Cl.
CPC ........ *H01L 25/0652* (2013.01); *H01L 21/486* (2013.01); *H01L 21/561* (2013.01);
(Continued)

(58) Field of Classification Search
CPC . H01L 25/0652; H01L 21/486; H01L 21/561; H01L 21/78; H01L 23/3128; H01L 23/49827; H01L 24/16; H01L 2224/16225; H01L 24/13; H01L 24/32; H01L 24/73; H01L 24/92; H01L 2224/13101; H01L 24/97; H01L 2224/16235;
(Continued)

(56) References Cited

U.S. PATENT DOCUMENTS

| 8,378,480 B2* | 2/2013 | Chen | H01L 24/97 438/456 |
| 8,779,599 B2* | 7/2014 | Lin | H01L 21/561 257/725 |

(Continued)

*Primary Examiner* — Vu A Vu
(74) *Attorney, Agent, or Firm* — Schwabe, Williamson & Wyatt, P.C.

(57) ABSTRACT

Embodiments include semiconductor packages and a method to form such semiconductor packages. A semiconductor package includes a plurality of dies on a substrate, and an encapsulation layer over the substrate. The encapsulation layer surrounds the dies. The semiconductor package also includes a plurality of dummy silicon regions on the substrate. The dummy silicon regions surround the dies and encapsulation layer. The plurality of dummy silicon regions are positioned on two or more edges of the substrate. The dummy silicon regions have a top surface substantially coplanar to a top surface of the dies. The dummy silicon regions include materials that include silicon, metals, or highly-thermal conductive materials. The materials have a thermal conductivity of approximately 120 W/mK or greater, or is equal to or greater than the thermal conductivity of silicon. An underfill layer surrounds the substrate and the dies, where the encapsulation layer surrounds portions of the underfill layer.

25 Claims, 4 Drawing Sheets

(51) Int. Cl.
*H01L 23/498* (2006.01)
*H01L 21/56* (2006.01)
*H01L 21/78* (2006.01)
*H01L 21/48* (2006.01)
*H01L 23/00* (2006.01)

(52) U.S. Cl.
CPC .......... *H01L 21/78* (2013.01); *H01L 23/3128* (2013.01); *H01L 23/49827* (2013.01); *H01L 24/16* (2013.01); *H01L 2224/16225* (2013.01)

(58) Field of Classification Search
CPC . H01L 2224/32225; H01L 2224/73204; H01L 2224/92125; H01L 2924/10253; H01L 2924/18161; H01L 2924/183; H01L 23/16; H01L 23/49816; H01L 23/5385; H01L 23/5389; H01L 25/0655; H01L 21/563
USPC ........................................................ 257/668
See application file for complete search history.

(56) References Cited

U.S. PATENT DOCUMENTS

| | | | |
|---|---|---|---|
| 9,093,337 B2 * | 7/2015 | Hwang | H01L 21/568 |
| 9,355,997 B2 * | 5/2016 | Katkar | H01L 23/3135 |
| 10,043,769 B2 * | 8/2018 | Shih | H01L 23/562 |
| 10,410,999 B2 * | 9/2019 | Baloglu | H01L 23/367 |
| 10,937,749 B2 * | 3/2021 | Shih | H01L 24/97 |
| 11,101,260 B2 * | 8/2021 | Hou | H01L 21/486 |
| 2019/0237454 A1 * | 8/2019 | Hou | H01L 23/49827 |

* cited by examiner

NO MOLD SHELF PACKAGE DESIGN AND PROCESS FLOW FOR ADVANCED PACKAGE ARCHITECTURES

FIELD

Embodiments relate to packaging semiconductor devices. More particularly, the embodiments relate to semiconductor devices with package substrates that have no mold shelf package designs and process flows for advanced package architectures.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with advanced package architectures, while optimizing the performance of each device, however is not without issue.

These advanced package architectures can include three-dimensional (3D) packaging technologies such as hybrid central processing unit (CPU) architectures, co-embedded interconnect bridge die architectures, and so on. The existing process flow for such advanced package architectures typically starts with a thermal compression bonding (TCB) of chiplets onto a silicon wafer, then followed by a wafer-level epoxy (or capillary underfill (CUF)) and a mold. This wafer molding process is necessary to reduce the wafer warpage and to enable the downstream processes. Lastly, the existing process flow generally ends with a singulation process, where the silicon wafer is cut into a final product (or a composite die).

One of the main problems of the existing process flow is that the advanced package architectures are encumbered due to the singulation process. That is, the singulation process cuts the silicon wafer through the molded regions, thereby the edges of the final product (or the composite die) have a mold shelf. This mold shelf leads to big problems for the thermal designs of such architectures due to the extremely low-thermal conductivity of the mold material. For example, during the TCB bonding of the composite die to the substrate, the corner/edge bumps of the first-level interconnects (FLIs) typically have a much lower temperature. Such FLI corner/edge bumps, therefore, may not even melt in order to form a good joint due to the mold shelf. Accordingly, the TCB process window is much smaller, and the yield losses are much higher with the mold shelf.

Furthermore, existing packaging solutions may use high-thermal conductivity mold materials, however the mold material thermal conductivity improvement is very limited due to much higher reliability issues with such mold materials and the conductivity of the filler materials. Other existing packaging solutions can include increasing the bond head peak temperature and the pedestal temperature. This leads to larger temperature gradients in the substrate during bonding, which in turn can lead to several issues such as excessive substrate expansion, non-uniform solder melting, and higher process time. Also, the TCB pedestal temperature is typically limited by the flux activity, the site time, and very little room for improvement.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages with dummy silicon regions/edges for advanced package architectures and methods of forming such semiconductor packages. In particular, these semiconductor packages implement no mold shelf package designs and process flows for advanced package architectures (e.g., co-embedded multi-die interconnect bridge (Co-EMIB) technologies, three-dimensional (3D) hybrid CPU packaging technologies, etc.). The semiconductor packages described below and methods of forming such semiconductor packages with a plurality of dies, a substrate, a plurality of through-silicon vias (TSVs), an encapsulation layer, an underfill layer, an adhesive layer, and a plurality of dummy silicon regions, according to one embodiment.

According to some embodiments, the semiconductor package described herein may be implemented as a composite die package (also referred to as a composite die stack (or stacked) package, a stacked composite die package, etc.) comprised of one or more composite dies, where the composite die includes dummy silicon regions (i.e., the composite die does not include mold shelfs). For example, the composite die may include the dies (or the chiplets) disposed on the substrate, where the encapsulation (or mold) layer surrounds the dies. Additionally, in these embodiments, the composite die may include the dummy silicon regions respectively surrounding the encapsulation layer and the dies. Accordingly, in some embodiments, the dummy silicon regions may be positioned (or located) at the peripheral outer edges of the composite die, and such dummy silicon regions may have top surfaces that are substantially coplanar to top surfaces of the dies. Accordingly, the embodiments of the composite die described herein replace the mold shelf with the dummy silicon regions, thereby enabling substantially higher thermal conductivity and minimizing the heat loss effect.

The embodiments described herein provide improvements to existing packaging solutions by implementing dummy silicon regions/edges for the advanced packaging technologies to substantially improve the thermal conductivity of such advanced packaging technologies. Additionally, the embodiments of the semiconductor packages described herein improve existing packaging solutions with the silicon material (or the like) of the dummy silicon regions, which substantially increases heat transfer during the thermal compression bonding (TCB) process, increases the process window and process yield, and does not increase the overall manufacturing (or packaging) costs.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages (or composite dies) with dies, TSVs, encapsulation layers (or mold layers), underfill layers, adhesive layers, and dummy silicon regions.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
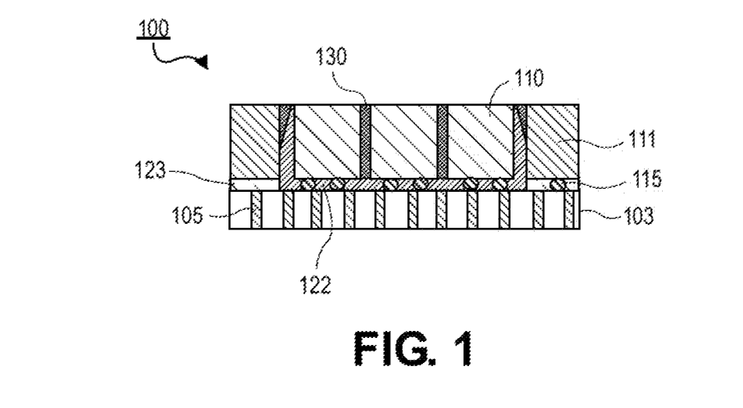
FIG. 1 is an illustration of a cross-sectional view of a semiconductor package with a plurality of dies, a substrate, a plurality of through-silicon vias (TSVs), an encapsulation layer, an underfill layer, an adhesive layer, and a plurality of dummy silicon regions, according to one embodiment.

Referring now to FIG. 1, a cross-sectional illustration of a semiconductor package 100 is shown, in accordance with an embodiment. In one embodiment, the semiconductor package 100 may include a plurality of dies 110, a substrate 103, a plurality of TSVs 105, an encapsulation layer 130, an underfill layer 122, an adhesive layer 123, and a plurality of dummy silicon regions 111, according to one embodiment. In some embodiments, the semiconductor package 100 may be implemented as a composite die package or the like.

For some embodiments, the dies 110 may be disposed on the substrate 103, where the dies 110 are coupled to the substrate 103 with a plurality of solder balls 115. In an embodiment, the underfill layer 122 may be disposed over and around the dies 110, where the underfill layer 122 may surround the solder balls 115 disposed between the dies 110 and the substrate 103. Additionally, for some embodiments, the encapsulation layer 130 may be disposed over and around the dies 110 and the underfill layer 122, where the encapsulation layer 130 may be disposed in between the dies 110 and may surround the underfill layer 122.

In some embodiments, the dummy silicon regions 111 may also be disposed on the substrate 103 and adjacent to the outer sidewalls (or edges) of the dies 110, where the dummy silicon regions 111 may be coupled onto the substrate 103 with the adhesive layer 123 and/or the solder balls 115. In an embodiment, the dummy silicon regions 111 may have a top surface that is substantially coplanar to a top surface of the dies 110. Also, in some embodiments, the substrate 103 may include the TSVs 105 or any other interconnects to conductively couple the dies 110 to another substrate or the like. Although some embodiments are not limited in this regard, the substrate 103 may in turn be coupled to another body (or substrate), for example, a computer motherboard (or the like) using any suitable structure such as solder balls (or bumps). In one embodiment, the substrate 103 may be a silicon wafer or the like. The substrate 103 may include a variety of electronic (or semiconductor) structures formed thereon or therein. In certain embodiments, the substrate 103 may be an organic substrate made up of one or more layers of polymer base materials, with conducting regions for transmitting signals.

For some embodiments, the substrate 103 may include, but is not limited to, a package, a substrate, a printed circuit board (PCB), and a motherboard. For one embodiment, the substrate 103 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where the dielectric layer may be a photosensitive dielectric layer. For one embodiment, the PCB may also include one or more conductive layers such as the TSVs 105, where the conductive layers may further include traces, lines, pads, vias, holes, and/or planes, and where the conductive layers may be comprised of one or more metallic materials (or the like) such as copper, nickel, palladium, tin, and/or alloys.

For one embodiment, the dies 110 may include a plurality of integrated circuit (IC) blocks that may be implemented to form the semiconductor package 100 or the composite die as described above. In such embodiments, the dies 110 may be implemented (or subdivided) into one or more distinct functional IC blocks. In some embodiments, the dies 110 may include, but are not limited to, a semiconductor die, an electronic device (e.g., a wireless device), an IC, a central processing unit (CPU), a microprocessor, a platform controller hub (PCH), a memory, and/or a field-programmable gate array (FPGA).

The dies 110 may be formed from a material such as silicon (or the like) and have circuitry thereon that is to be coupled to the substrate 103. One or more connections between the substrate 103 and the dies 110—e.g., including the solder bumps 115—may include one or more interconnect structures and underfill layers such as the TSVs 105 and the underfill layer 122. In some embodiments, these interconnect structures (or connections) may variously comprise an alloy of nickel, palladium, and tin (and, in some embodiments, copper).

In one embodiment, the underfill layer 122 may surround the outer sidewalls of one or more of the outer dies 110 (e.g., the outer dies 110 may be the dies that are positioned on the outer edges of the substrate 103). The underfill layer 122 may be disposed between the outer dies 110 and the dummy silicon regions 111. For one embodiment, the underfill layer 122 may be one or more polymer (or epoxy) materials that are injected between the dies 110, the substrate 103, and the solder balls 115. For other embodiments, the underfill layer 122 may be a molded underfill (MUF) layer, a capillary underfill (CUF) layer, and/or the like.

In some embodiments, as shown in FIG. 1, the encapsulation layer 130 may surround the underfill layer 122 and the outer dies 110. The encapsulation layer 130 may also be disposed between the outer dies 110 and the dummy silicon regions 111. Additionally, the encapsulation layer 130 may be disposed between one or more inner sidewalls of the dies 110, where the top surfaces of the encapsulation layer 130 may be substantially coplanar to the top surfaces of the dies 110 and the dummy silicon regions 111. In one embodiment, the encapsulation layer 130 may be a mold layer, an epoxy underfill, or the like. For one embodiment, the encapsulation layer 130 may include an epoxy (e.g., a soft epoxy, a stiff epoxy, opaque epoxy, etc.) with one or more filler materials. In an embodiment, the encapsulation layer 130 may be a mold layer or a layer of any similar encapsulation materials. In an embodiment, the encapsulation layer 130 may be compression molded, laminated, or the like.

In some embodiments, the dummy silicon regions 111 may be disposed on the peripheral outer edges of the substrate 103, where the dummy silicon regions 111 may be disposed adjacent to and around (or surrounding) the dies 110. In an embodiment, the dummy silicon regions 111 may have substantially the same width. In another embodiment, the dummy silicon regions 111 may have different widths. For one embodiment, the dummy silicon regions 111 may have a width of approximately 250 um or greater. Also, as described above, the dummy silicon regions 111 may have a thickness that is substantially equal to a thickness of the dies 110. While, in alternate embodiments, the dummy silicon regions 111 may have a thickness that is different than a thickness of the dies 110.

In the embodiment, the dummy silicon regions 111 may be comprised of one or more materials such as silicon, metals, and/or highly-thermal conductive materials. For example, the dummy silicon regions 111 may have a thermal conductivity of approximately 120 W/mK or greater. Alternatively, the dummy silicon regions 111 may have a thermal conductivity that is equal to or greater than the thermal conductivity of silicon. The dummy silicon regions 111 may have no active and/or passive IC devices, or substantially no active and/or passive IC devices (such as transistors, capacitors, resistors, or the like) formed in the dummy silicon regions 111.

The dummy silicon regions 111 may be coupled (or attached) to the top surface of the substrate 103 with the adhesive layer 123 and/or the solder balls 115 (or other copper interconnect bumps/joints). The dummy silicon regions 111 may increase the heat transfer during TCB process and subsequently increase the process window and process yield. As described below, the dummy silicon regions 111 may be disposed on the substrate 103 and adjacent to the dies 110 during the TCB process and may subsequently be implemented with a molding process, a polishing/grinding process, and so on.

Lastly, the singulation process may be implemented and cut through the wafer to singulate the semiconductor package 100 from the other semiconductor packages. As such, the laser (or cutting tool) may cut through the dummy silicon regions 111—rather than through the encapsulation layer 130—to create the semiconductor package 100 (or a final composite die) with silicon materials (or other highly thermal conductive materials) at the edges of such semiconductor package 100. In one embodiment, the dummy silicon regions 111 may have one or more outer sidewalls, where the one or more outer sidewalls may be substantially vertical or tapered (i.e., the outer sidewalls may be the sidewalls that are formed with the singulation process). Also, in alternative embodiments, the semiconductor package 100 may implement the dummy silicon regions 111 at one or more of the outer edges of the substrate 103, while the encapsulation layer 130 may be implemented on the other regions of the outer edges of the substrate 103 that are not covered by the silicon materials of the dummy silicon regions 111 (if needed) based on the desired packaging design/application. That is, in these alternative embodiments, the outer edges of the semiconductor package 100 may include both the dummy silicon regions 111 and the encapsulation layer 130.

Note that the semiconductor package 100 may include fewer or additional packaging components based on the desired packaging design.

FIGS. 2A-2D are illustrations of cross-sectional views of a process flow to form a semiconductor package 200 with a plurality of dies 210, a substrate 203, a plurality of TSVs 205, an encapsulation layer 230, an underfill layer 222, an adhesive layer 223, and a plurality of dummy silicon regions 211, according to one embodiment. The process flow illustrated in FIGS. 2A-2D forms the semiconductor package 200 that may be substantially similar to the semiconductor package 100 described above in FIG. 1. Likewise, the components of the semiconductor package 200 are substantially similar to the components of the semiconductor package 100 described above in FIG. 1. Accordingly, the process flow of the semiconductor package 200 illustrates one of the approaches to implement no mold shelf package designs for advanced package architectures. In particular, the embodiments of the process flow illustrated in FIGS. 2A-2D may be implemented at a wafer level to form a composite die from a wafer, such as the semiconductor package 200 having the dummy silicon regions 211 disposed and positioned at the peripheral outer edges of the substrate 203.

Figure 2A:
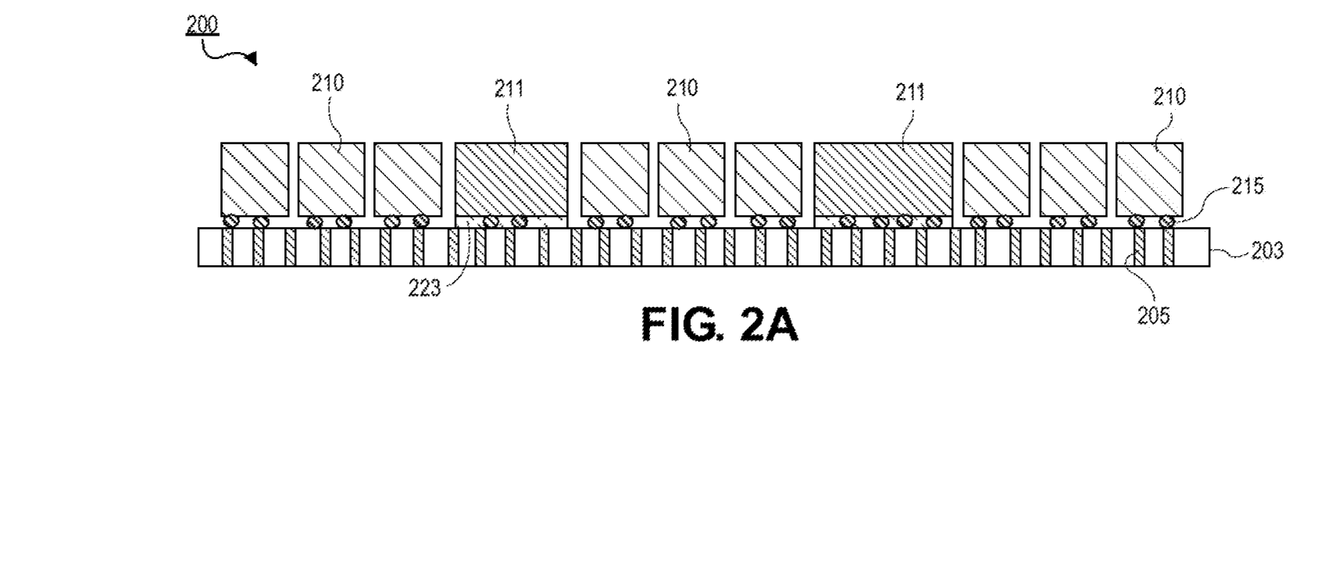
FIGS. 2A-2D are illustrations of cross-sectional views of a process flow to form a semiconductor package with a plurality of dies, a substrate, a plurality of TSVs, an encapsulation layer, an underfill layer, an adhesive layer, and a plurality of dummy silicon regions, according to one embodiment.

Referring now to FIG. 2A, a cross-sectional illustration of a semiconductor package 200 is shown, in accordance with an embodiment. In an embodiment, the semiconductor package 200 may include a plurality of dies 210, a plurality of dummy silicon dies 211, and a substrate 203. For one embodiment, the dies 210 and the dummy silicon dies 211 may be disposed onto the substrate 203 with a pick-and-place process or the like. In one embodiment, the dies 210 may be coupled to the substrate 203 with a plurality of solder balls 215. In an additional embodiment, the dummy silicon dies 211 may be coupled (or attached) to the substrate 203 with the solder balls 215 and/or one or more adhesive layers 223 (i.e., the dummy silicon dies 211 may be coupled directly to the top surface of the substrate 203 with the adhesive layers 223 without any solder balls 215). Prior to the singulation process illustrated in FIGS. 2C-2D, the dummy silicon dies 211 may have a width that is greater than a width of the dies 210.

As shown in FIG. 2A, the dummy silicon dies 211 may be positioned in between the dies 210, where, for example, one set of the dies 210 may be centrally positioned on the substrate 203 as two of the dummy silicon dies 211 may be positioned adjacent to such set of the dies 210 (i.e., one dummy silicon die 211 positioned on the left and another dummy silicon die 211 positioned on the right of the centrally positioned dies 210). In one embodiment, the substrate 203 may include a plurality of TSVs 205 or any other conductive interconnects. The substrate 203, the TSVs 205, the dies 210, the dummy silicon dies 211, the adhesive layer 223, and the solder balls 215 may be substantially similar to the substrate 103, the TSVs 105, the dies 110, the dummy silicon dies 111, the adhesive layer 123, and the solder balls 115 described above in FIG. 1.

Figure 2B:
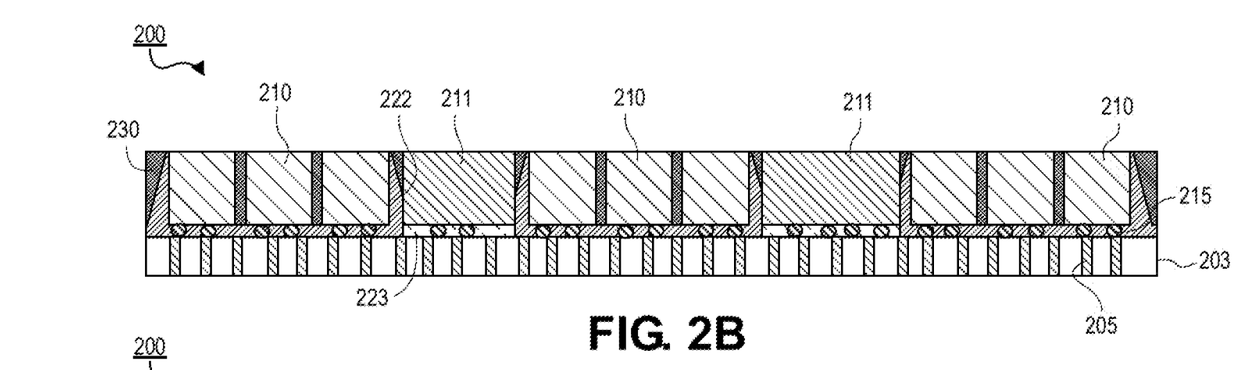

Referring now to FIG. 2B, a cross-sectional illustration of a semiconductor package 200 is shown, in accordance with an embodiment. In an embodiment, an underfill layer 222 may be disposed over and around the dies 210 and the dummy silicon dies 211. The underfill layer 222 may be disposed between the dies 210 and the substrate 203, where the underfill layer 222 may surround the solder balls 215, the adhesive layers 223, the dummy silicon dies 211, and one or more of the dies 210. Additionally, in some embodiments, an encapsulation layer 230 may be disposed over and around the dies 210, the dummy silicon dies 211, and the underfill layer 222, where the encapsulation layer 230 may thus be disposed between the dies 210. The encapsulation layer 230 may surround the underfill layer 222 and the dummy silicon dies 211.

The underfill layer 222 and the encapsulation layer 230 may be substantially similar to the underfill layer 122 and the encapsulation layer 130 described above in FIG. 1. The underfill layer 222 and the encapsulation layer 230 may be implemented on the substrate 203 with a TCB (or a wafer-level TCB) process or the like. Furthermore, in an embodiment, a planarization process (or the like) may grind/polish the encapsulation layer 230 as such the top surfaces of the encapsulation layer 230 may be substantially coplanar to the top surfaces of the dies 210 and the dummy silicon dies 211.

Figure 2C:
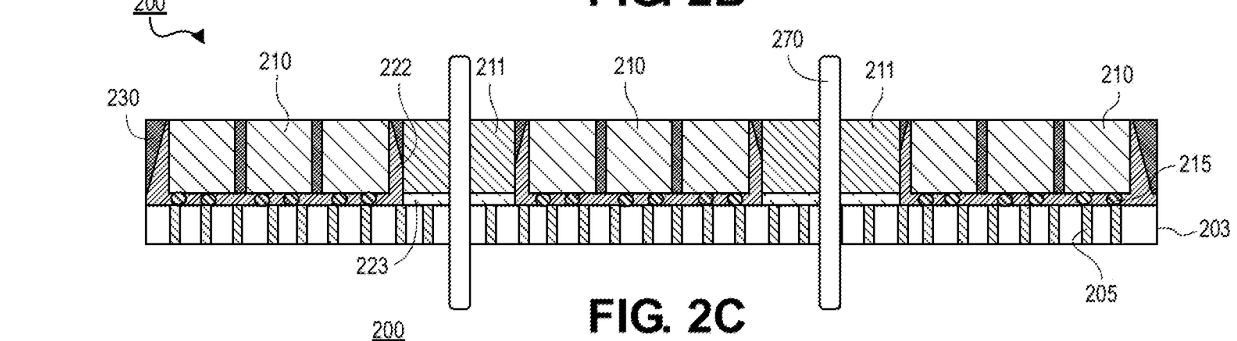

Referring now to FIG. 2C, a cross-sectional illustration of a semiconductor package 200 is shown, in accordance with an embodiment. In an embodiment, a singulation process may be implemented to cut the substrate 203 into one or more composite dies. The singulation process may implement a cutting tool 270, such as a saw, a laser, or the like, to cut through the dummy silicon dies 211 on the substrate 203. For example, the cutting tool 270 may be positioned directly on/over the dummy silicon dies 211, where the cutting tool 270 may subsequently cut (or slice) the dummy silicon dies 211 in half (or at the approximate center of the dummy silicon dies 211) as shown below in FIG. 2D.

Figure 2D:
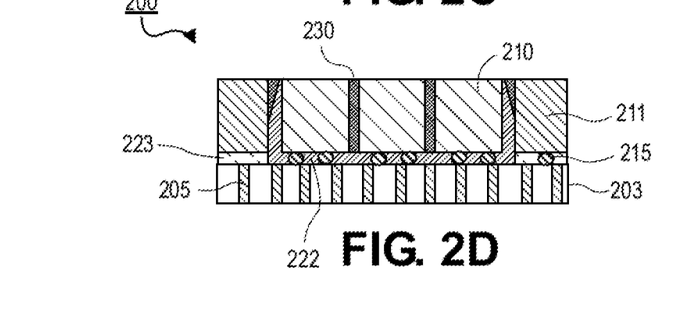

Referring now to FIG. 2D, a cross-sectional illustration of a semiconductor package 200 is shown, in accordance with an embodiment. In an embodiment, after the singulation process is implemented, the initial substrate (or wafer) may be cut into one or more semiconductor packages (or composite dies) to form a singulated semiconductor package such as the semiconductor package 200. Additionally, as shown in FIGS. 2C-2D, the cutting tool 270 may be implemented to cut through the dummy silicon dies 211—rather than through the encapsulation layer 230—to create the semiconductor package 200. The semiconductor package 200 may thus include silicon materials (or other highly thermal conductive materials) at the edges of such semiconductor package 200—without an encapsulation layer shelf (or a mold shelf).

Also, after the singulation process, the initial dummy silicon dies may be cut into a plurality of dummy silicon regions 211 as shown in FIG. 2D. For example, one of the initial dummy silicon dies may be cut in half (or at the approximate center) to form one dummy silicon region 211 at one of the peripheral edges of the substrate 203. In one embodiment, the dummy silicon regions 211 may have one or more outer sidewalls, where the one or more outer sidewalls may be substantially vertical or tapered (i.e., the outer sidewalls may be the sidewalls that are formed with the singulation process). Also, in alternative embodiments, the semiconductor package 200 may implement the dummy silicon regions 211 at one or more of the outer edges of the substrate 203, while the encapsulation layer 230 may be implemented on the other regions of the outer edges of the substrate 203 (if needed) based on the desired packaging design/application. That is, in these alternative embodiments, the outer edges of the semiconductor package 200 may include both the dummy silicon regions 211 and the encapsulation layer 230.

Note that the semiconductor package 200 of FIGS. 2A-2D may include fewer or additional packaging components based on the desired packaging design.

Figure 3:
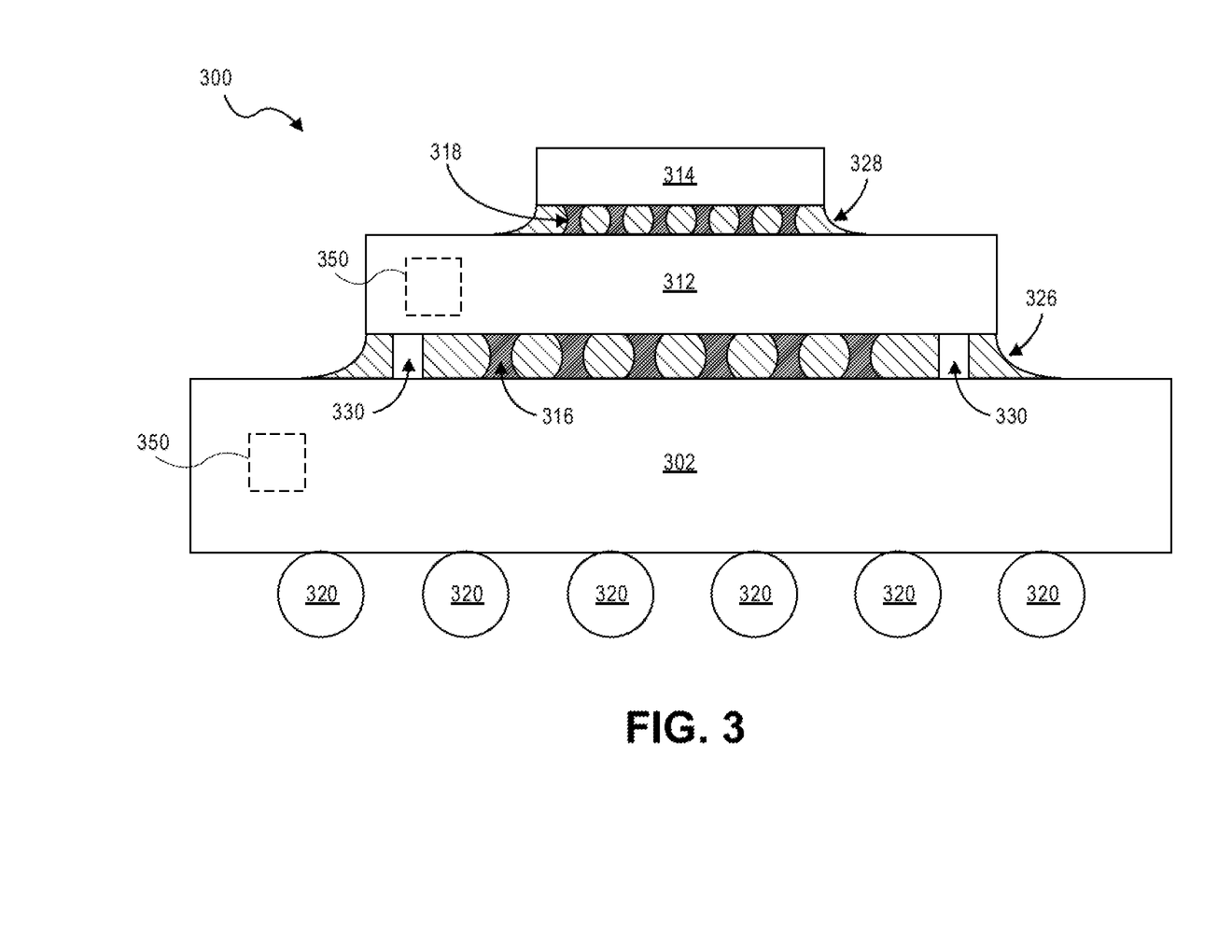
FIG. 3 is an illustration of a cross-sectional view of a semiconductor package with a die, a substrate, and a package substrate, where the substrate and/or the package substrate may include a composite die with a plurality of dummy silicon regions, according to one embodiment.

FIG. 3 is an illustration of a cross-sectional view of a semiconductor packaged system 300 including a die 314, a substrate 312, a package substrate 302, and one or more composite dies 350 (or semiconductor packages), according to one embodiment. FIG. 3 illustrates a semiconductor packaged system 300 including a die 314, a substrate 312 (or an interposer), interconnect structures (e.g., the plurality of bumps disposed below the die 314 and the substrate 312), and the package substrate 302, where the substrate 312 and/or the package substrate 302 may include the one or more composite dies without mold shelves (e.g., as shown with the semiconductor packages 100 and 200 of FIGS. 1 and 2A-2D), according to some embodiments.

For one embodiment, the semiconductor package 300 may implement the composite dies 350 on the substrate 312 and/or the package substrate 302, where such composite dies 350 may include dies, dummy silicon regions (or regions with other highly thermal conductive materials), encapsulation layers, and substrates as described herein. In one embodiment, the composite dies 350 may be substantially similar to the semiconductor packages 100 and 200 described above in FIGS. 1 and 2A-2D. Note that the semiconductor package 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a ball grid array (BGA) package, a land grid array (LGA) package, and/or a pin grid array (PGA) package. For one embodiment, the die 314 is coupled to the substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with TSVs. For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an IC, a CPU, a microprocessor, a PCH, a memory, and/or a FPGA. The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be MUF.

Note that the semiconductor package 300 may include fewer or additional packaging components based on the desired packaging design.

Figure 4:
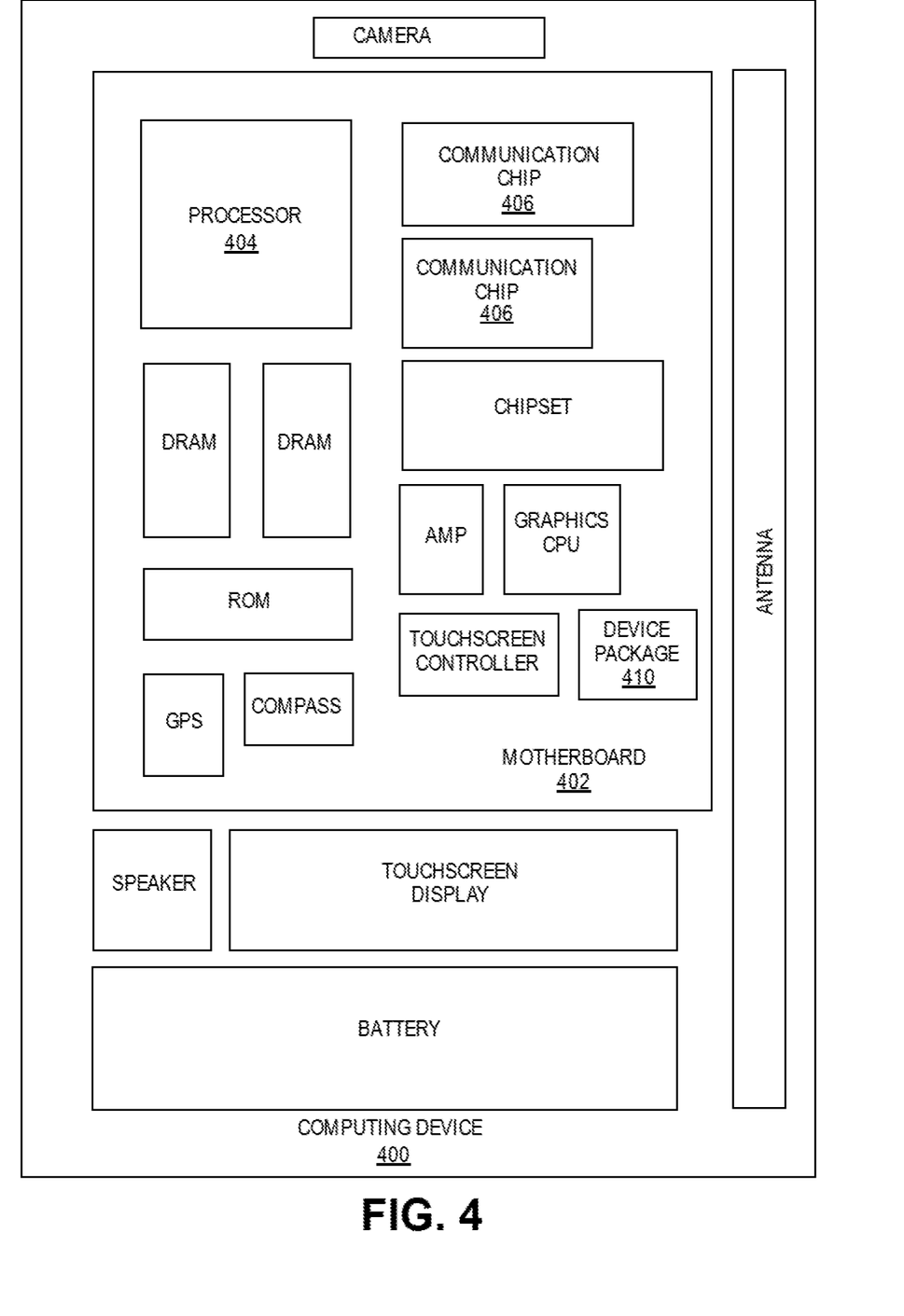
FIG. 4 is an illustration of a schematic block diagram illustrating a computer system that utilizes a semiconductor package with composite dies with dummy silicon regions, according to one embodiment.

FIG. 4 is an illustration of a schematic block diagram illustrating a computer system 400 that utilizes a device package 410 (or a semiconductor package) with a plurality of dies, a substrate, a plurality of TSVs, an encapsulation layer, an underfill layer, an adhesive layer, and a plurality of dummy silicon regions, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, a composite die package, and/or a PCB. In one embodiment, device package 410 may be a semiconductor package that is substantially similar to the semiconductor packages 100 and 200 of FIGS. 1 and 2A-2D described herein. Device package 410 may include a semiconductor package (or a composite die) with the dummy silicon regions—rather than the mold shelfs—positioned on the peripheral outer edges of the substrate as described herein (e.g., as illustrated and described above with the semiconductor packages 100 and 200 of FIGS. 1 and 2D)—or any other components from the figures described herein.

Note that device package 410 may be a single component/device, a subset of components, and/or an entire system, as the materials, features, and components may be limited to device package 410 and/or any other component of the computing device 400 that may need semiconductor packages (or composite dies) with dummy silicon regions on the outer edges as described herein (e.g., the motherboard 402, the processor 404, and/or any other component of the computing device 400 that may need the embodiments of such semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a plurality of dies on a substrate; an encapsulation layer over the substrate, wherein the encapsulation layer surrounds the plurality of dies; and a plurality of dummy silicon regions on the substrate, wherein the plurality of dummy silicon regions surround the dies and the encapsulation layer, wherein the plurality of dummy silicon regions are positioned on two or more edges of the substrate, and wherein the dummy silicon regions have a top surface that is substantially coplanar to a top surface of the plurality of dies.

In example 2, the subject matter of example 1 can optionally include that the plurality of dummy silicon regions have a thickness that is substantially equal to a thickness of the plurality of dies.

In example 3, the subject matter of examples 1-2 can optionally include that the plurality of dummy silicon regions include one or more materials.

In example 4, the subject matter of examples 1-3 can optionally include that the one or more materials include silicon, metals, or highly-thermal conductive materials.

In example 5, the subject matter of examples 1-4 can optionally include that the one or more materials have a thermal conductivity of approximately 120 W/mK or greater, or wherein the one or more silicon regions have a thermal conductivity that is equal to or greater than the thermal conductivity of silicon.

In example 6, the subject matter of examples 1-5 can optionally include that the plurality of dummy silicon regions are coupled onto the substrate with an adhesive layer.

In example 7, the subject matter of examples 1-6 can optionally include an underfill layer over the substrate; a plurality of TSVs in the substrate; and a plurality of solder balls coupled to the plurality of dies and the substrate, wherein the underfill layer surrounds the dies and the plurality of solder balls, and wherein the encapsulation layer surrounds portions of the underfill layer.

In example 8, the subject matter of examples 1-7 can optionally include that the TSVs couple the plurality of dies to the substrate, wherein the encapsulation layer is between the plurality of dies, wherein the encapsulation layer has a top surface that is substantially coplanar to the top surfaces of the plurality of dies and the plurality of dummy silicon regions.

In example 9, the subject matter of examples 1-8 can optionally include that each of the edges of the substrate is comprised of the dummy silicon regions or the encapsulation layer.

In example 10, the subject matter of examples 1-9 can optionally include that the plurality of dummy silicon regions are coupled onto the substrate with the adhesive layer or the plurality of solder balls.

Example 11 is a semiconductor package, comprising: a first substrate on a package substrate; a first die on the first substrate; and a composite die on the first substrate or the package substrate, wherein the composite die includes a plurality of dies on a substrate; an encapsulation layer over the substrate, wherein the encapsulation layer surrounds the plurality of dies; and a plurality of dummy silicon regions on the substrate, wherein the plurality of dummy silicon regions surround the dies and the encapsulation layer, wherein the plurality of dummy silicon regions are positioned on two or more edges of the substrate, and wherein the dummy silicon regions have a top surface that is substantially coplanar to a top surface of the plurality of dies.

In example 12, the subject matter of example 11 can optionally include that the plurality of dummy silicon regions have a thickness that is substantially equal to a thickness of the plurality of dies.

In example 13, the subject matter of examples 11-12 can optionally include the plurality of dummy silicon regions include one or more materials.

In example 14, the subject matter of examples 11-13 can optionally include that the one or more materials include silicon, metals, or highly-thermal conductive materials.

In example 15, the subject matter of examples 11-14 can optionally include that the one or more materials have a thermal conductivity of approximately 120 W/mK or greater, or wherein the one or more silicon regions have a thermal conductivity that is equal to or greater than the thermal conductivity of silicon.

In example 16, the subject matter of examples 11-15 can optionally include that the plurality of dummy silicon regions are coupled onto the substrate with an adhesive layer.

In example 17, the subject matter of examples 11-16 can optionally include that the composite die further comprises: an underfill layer over the substrate; a plurality of TSVs in the substrate; and a plurality of solder balls coupled to the plurality of dies and the substrate, wherein the underfill layer surrounds the dies and the plurality of solder balls, wherein the encapsulation layer surrounds portions of the underfill layer, and wherein the plurality of dummy silicon regions are coupled onto the substrate with the adhesive layer or the plurality of solder balls.

In example 18, the subject matter of examples 11-17 can optionally include that the TSVs couple the plurality of dies to the substrate, wherein the encapsulation layer is between the plurality of dies, wherein the encapsulation layer has a top surface that is substantially coplanar to the top surfaces of the plurality of dies and the plurality of dummy silicon regions.

In example 19, the subject matter of examples 11-18 can optionally include that each of the edges of the substrate is comprised of the dummy silicon regions or the encapsulation layer.

Example 20 is a method to form a semiconductor package, comprising: disposing a plurality of dies on a substrate; disposing a plurality of dummy silicon dies on the substrate, wherein the plurality of dummy silicon dies are coupled onto the substrate with an adhesive layer, and wherein the plurality of dummy silicon dies are disposed adjacent to the plurality of dies; disposing an encapsulation layer over and around the plurality of dies, the plurality of dummy silicon dies, and the substrate, wherein the encapsulation layer surrounds the plurality of dies; and singulating the plurality of dummy silicon dies and the substrate to form the semiconductor package with a plurality of dummy silicon regions, wherein the plurality of dummy silicon regions are positioned on two or more edges of the substrate, and wherein the dummy silicon regions have a top surface that is substantially coplanar to a top surface of the plurality of dies.

In example 21, the subject matter of example 20 can optionally include that the plurality of dummy silicon regions have a thickness that is substantially equal to a thickness of the plurality of dies, wherein the plurality of dummy silicon regions include one or more materials, and wherein the one or more materials include silicon, metals, or highly-thermal conductive materials.

In example 22, the subject matter of examples 20-21 can optionally include that the one or more materials have a thermal conductivity of approximately 120 W/mK or greater, or wherein the one or more silicon regions have a thermal conductivity that is equal to or greater than the thermal conductivity of silicon.

In example 23, the subject matter of examples 20-22 can optionally include the disposing an underfill layer over the substrate; disposing a plurality of TSVs in the substrate; and coupling a plurality of solder balls to the plurality of dies and the substrate, wherein the underfill layer surrounds the dies and the plurality of solder balls, and wherein the encapsulation layer surrounds portions of the underfill layer.

In example 24, the subject matter of examples 20-23 can optionally include that the TSVs couple the plurality of dies to the substrate, wherein the encapsulation layer is between the plurality of dies, and wherein the encapsulation layer has a top surface that is substantially coplanar to the top surfaces of the plurality of dies and the plurality of dummy silicon regions.

In example 25, the subject matter of examples 20-24 can optionally include that each of the edges of the substrate is comprised of the dummy silicon regions or the encapsulation layer, and wherein the plurality of dummy silicon regions are coupled onto the substrate with the adhesive layer or the plurality of solder balls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
a plurality of dies on a substrate, the substrate having a first straight edge laterally opposite to a second straight edge, the substrate comprising silicon, the substrate having semiconductor structures, and the substrate having through substrate vias (TSVs);
an encapsulation layer over the substrate, wherein the encapsulation layer surrounds the plurality of dies; and
a plurality of dummy silicon regions on the substrate, wherein the plurality of dummy silicon regions have a top surface that is substantially coplanar to a top surface of the plurality of dies, and wherein the plurality of dummy silicon regions comprises a first dummy silicon die and a second dummy silicon die, the second dummy silicon die discontinuous with the first dummy silicon die, the first dummy silicon die proximate to the first straight edge of the substrate, and the second dummy silicon die proximate to the second straight edge of the substrate.

2. The semiconductor package of claim 1, wherein the plurality of dummy silicon regions have a thickness that is substantially equal to a thickness of the plurality of dies.

3. The semiconductor package of claim 1, wherein the plurality of dummy silicon regions include one or more materials.

4. The semiconductor package of claim 3, wherein the one or more materials include silicon, metals, or highly-thermal conductive materials.

5. The semiconductor package of claim 4, wherein the one or more materials have a thermal conductivity of approximately 120 W/mK or greater, or wherein the one or more materials regions have a thermal conductivity that is equal to or greater than the thermal conductivity of silicon.

6. The semiconductor package of claim 1, wherein the plurality of dummy silicon regions are coupled onto the substrate with an adhesive layer.

7. The semiconductor package of claim 6, further comprising:
an underfill layer over the substrate; and
a plurality of solder balls coupled to the plurality of dies and the substrate, wherein the underfill layer surrounds the plurality of dies and the plurality of solder balls, and wherein the encapsulation layer surrounds portions of the underfill layer.

8. The semiconductor package of claim 7, wherein the TSVs couple the plurality of dies to the substrate, wherein the encapsulation layer is between the plurality of dies, wherein the encapsulation layer has a top surface that is substantially coplanar to the top surfaces of the plurality of dies and the plurality of dummy silicon regions.

9. The semiconductor package of claim 1, wherein each of the edges of the substrate is comprised of the plurality of dummy silicon regions or the encapsulation layer.

10. The semiconductor package of claim 7, wherein the plurality of dummy silicon regions are coupled onto the substrate with the adhesive layer or the plurality of solder balls.

11. A semiconductor package, comprising:
a first substrate on a package substrate, the first substrate having a first straight edge laterally opposite to a second straight edge, the first substrate comprising silicon, the first substrate having semiconductor structures, and the first substrate having through substrate vias (TSVs; and a composite die on the first substrate, wherein the composite die includes:
  a plurality of dies on the first substrate;
  an encapsulation layer over the first substrate, wherein the encapsulation layer surrounds the plurality of dies; and
  a plurality of dummy silicon regions on the first substrate, wherein the plurality of dummy silicon regions have a top surface that is substantially coplanar to a top surface of the plurality of dies, and wherein the plurality of dummy silicon regions comprises a first dummy silicon die and a second dummy silicon die, the second dummy silicon die discontinuous with the first dummy silicon die, the first dummy silicon die proximate to the first straight edge of the substrate, and the second dummy silicon die proximate to the second straight edge of the substrate.

12. The semiconductor package of claim 11, wherein the plurality of dummy silicon regions have a thickness that is substantially equal to a thickness of the plurality of dies.

13. The semiconductor package of claim 11, wherein the plurality of dummy silicon regions include one or more materials.

14. The semiconductor package of claim 13, wherein the one or more materials include silicon, metals, or highly-thermal conductive materials.

15. The semiconductor package of claim 14, wherein the one or more materials have a thermal conductivity of approximately 120 W/mK or greater, or wherein the one or more materials have a thermal conductivity that is equal to or greater than the thermal conductivity of silicon.

16. The semiconductor package of claim 11, wherein the plurality of dummy silicon regions are coupled onto the substrate with an adhesive layer.

17. The semiconductor package of claim 16, wherein the composite die further comprises:
  an underfill layer over the first substrate; and
  a plurality of solder balls coupled to the plurality of dies and the first substrate, wherein the underfill layer surrounds the plurality of dies and the plurality of solder balls, wherein the encapsulation layer surrounds portions of the underfill layer, and wherein the plurality of dummy silicon regions are coupled onto the first substrate with the adhesive layer or the plurality of solder balls.

18. The semiconductor package of claim 17, wherein the TSVs couple the plurality of dies to the first substrate, wherein the encapsulation layer is between the plurality of dies, wherein the encapsulation layer has a top surface that is substantially coplanar to the top surfaces of the plurality of dies and the plurality of dummy silicon regions.

19. The semiconductor package of claim 11, wherein each of the edges of the first substrate is comprised of the plurality of dummy silicon regions or the encapsulation layer.

20. A method to form a semiconductor package, comprising:
  disposing a plurality of dies on a substrate, the substrate comprising silicon, the substrate having semiconductor structures, and the substrate having through substrate vias (TSVs);
  disposing a plurality of dummy silicon dies on the substrate, wherein the plurality of dummy silicon dies are coupled onto the substrate with an adhesive layer, and wherein the plurality of dummy silicon dies are disposed adjacent to the plurality of dies;
  disposing an encapsulation layer over and around the plurality of dies, the plurality of dummy silicon dies, and the substrate, wherein the encapsulation layer surrounds the plurality of dies; and
  singulating the plurality of dummy silicon dies and the substrate to form the semiconductor package with a plurality of dummy silicon regions, and to form the substrate having a first straight edge laterally opposite to a second straight edge, wherein the plurality of dummy silicon regions have a top surface that is substantially coplanar to a top surface of the plurality of dies, and wherein the plurality of dummy silicon regions comprises a first dummy silicon die and a second dummy silicon die, the second dummy silicon die discontinuous with the first dummy silicon die, the first dummy silicon die proximate to the first straight edge of the substrate, and the second dummy silicon die proximate to the second straight edge of the substrate.

21. The method of claim 20, wherein the plurality of dummy silicon regions have a thickness that is substantially equal to a thickness of the plurality of dies, wherein the plurality of dummy silicon regions include one or more materials, and wherein the one or more materials include silicon, metals, or highly-thermal conductive materials.

22. The method of claim 21, wherein the one or more materials have a thermal conductivity of approximately 120 W/mK or greater, or wherein the one or more materials have a thermal conductivity that is equal to or greater than the thermal conductivity of silicon.

23. The method of claim 20, further comprising:
  disposing an underfill layer over the substrate; and
  coupling a plurality of solder balls to the plurality of dies and the substrate, wherein the underfill layer surrounds the plurality of dies and the plurality of solder balls, and wherein the encapsulation layer surrounds portions of the underfill layer.

24. The method of claim 23, wherein the TSVs couple the plurality of dies to the substrate, wherein the encapsulation layer is between the plurality of dies, and wherein the encapsulation layer has a top surface that is substantially coplanar to the top surfaces of the plurality of dies and the plurality of dummy silicon regions.

25. The method of claim 23, wherein each of the edges of the substrate is comprised of the plurality of dummy silicon regions or the encapsulation layer, and wherein the plurality of dummy silicon regions are coupled onto the substrate with the adhesive layer or the plurality of solder balls.

* * * * *